Figure 1:
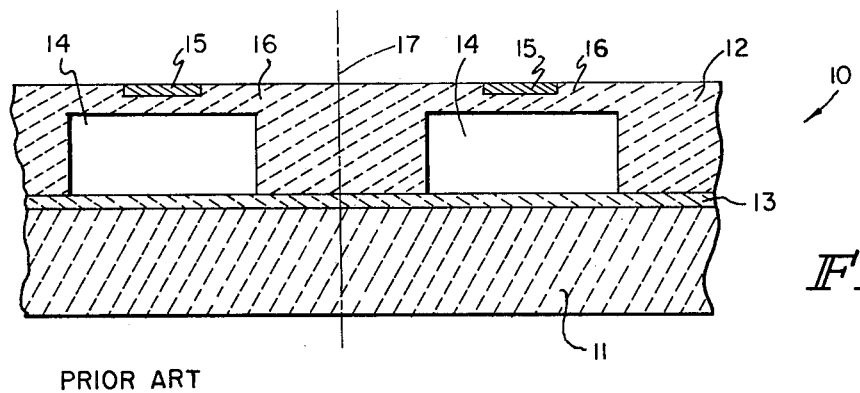

United States Patent [19]

Wallis

[11] 4,121,334
[45] Oct. 24, 1978

[54] APPLICATION OF FIELD-ASSISTED BONDING TO THE MASS PRODUCTION OF SILICON TYPE PRESSURE TRANSDUCERS

[75] Inventor: George Wallis, Lexington, Mass.

[73] Assignee: P. R. Mallory & Co. Inc., Indianapolis, Ind.

[21] Appl. No.: 759,521

[22] Filed: Jan. 14, 1977

Related U.S. Application Data

[63] Continuation of Ser. No. 533,716, Dec. 18, 1974, Pat. No. 3,943,398.

[51] Int. Cl.$^2$ .................................................. B01J 17/00
[52] U.S. Cl. ................................. 29/589; 29/610 SG; 338/4
[58] Field of Search ............ 29/574, 580, 589, 583, 29/610 SG, 590, 591; 338/2, 4

[56] References Cited

U.S. PATENT DOCUMENTS

| 3,697,917 | 10/1972 | Orth et al. | 338/2 |
| 3,800,264 | 3/1974 | Kurtz et al. | 338/2 |
| 3,909,924 | 10/1975 | Vindasius et al. | 29/574 |

Primary Examiner—Joseph H. McGlynn
Assistant Examiner—E. F. Desmond
Attorney, Agent, or Firm—Hoffmann, Meyer & Coles

[57] ABSTRACT

A method for mass producing silicon type pressure transducers and transducers resultant therefrom are disclosed. In the method, the major components of a plurality of transducers are simultaneously joined together by a field-assisted bonding technique which allows the components to be made of materials having an approximate match in coefficients of thermal expansion and therefore imparts improved performance characteristics to the individual transducers during operation. This method of mass production of transducers reduces the amount of operational steps and significantly reduces the amount of time and labor required for manufacture.

3 Claims, 4 Drawing Figures

U.S. Patent      Oct. 24, 1978      4,121,334

APPLICATION OF FIELD-ASSISTED BONDING TO THE MASS PRODUCTION OF SILICON TYPE PRESSURE TRANSDUCERS

This is a continuation of application Ser. No. 533,716, filed Dec. 18, 1974, now U.S. Pat. No. 3,943,398.

The present invention relates to electrical devices, and more particularly, to the mass production of silicon type pressure transducers using the field-assisted bonding technique.

Generally, a "transducer" is defined as measuring device which provides a usable output in response to a specific measurand such as a physical quantity, property or condition. Silicon type pressure transducers are used in a wide variety of applications to monitor changes in the pressure of fluids and especially where remote and sensitive monitoring means are required which must occupy a small amount of space. For example, these devices have found extensive applications such as in laboratory test equipment and in remote sensing systems.

Basically, the silicon type pressure transducer consists of a small block of silicon containing material with an enclosed cavity containing a gas or a vacuum. One of the walls of the cavity is thin compared to the other walls of the block forming the cavity. This thin wall acts as a diaphragm and deforms with changes in pressure while the other walls do not significantly deform. Located in the thin wall or diaphragm are diffused integrated circuits such as a Wheatstone bridge, which repond to the deformation of the thin wall during changes in pressure. These integrated circuits are designed so as to alter electrical signals emanating from the circuit is proportion to the amount of deformation and thus pressure change. The changes in electrical signals therefore provide a means for monitoring pressure changes. Since the thin wall or diaphragm is typically very thin, on the order of mils, small changes in pressure may be detected by the device.

In one method, silicon type pressure transducers are made in a batch process from one large silicon structure or slice is subsequently divided into a plurality of individual devices. The starting material is generally a relatively large circular slice of monocrystalline silicone. Integrated circuits are diffused into the slice by well known techniques, and then the opposite side of the slice etched through a mask to provide a plurality of cavities in the slice, each cavity directly opposite at least one diffused integrated circuit. Thus, the etching of the slice produces the thin wall or diaphragm for the transducer.

A second slice of silicon of approximately the same size and thickness as the first slice is then covered with a thin layer of glass frit and fired so as to form a uniform glass layer, typically 1 mil thick. The cavity side of the first slice is then placed on the glass layer of the second silicon slice and the assembly fired again so as to join the two slices together into a unitary structure. The structure is then divided by sawing or the like into individual pressure transducers.

The above described conventional method for making silicon type pressure transducers may generally be termed the frit method.

The above conventional frit method of making silicon type pressure transducers has at least two inherent problems associated with its use. The first is due to the fact that at temperatures above about 500° C, the integrated circuits on the silicon slice may be harmfully damaged. Therefore the glass frit used for joining the two silicon slices must have a melting or fusion temperature below about 500° C. Glass frits that have melting points below this maximum temperature generally have much higher coefficients of thermal expansion than silicon, typically glass frits with this characteristic have a coefficient of thermal expansion about three times larger than that of silicon. Thus during changes in temperature, the mismatch of coefficients of thermal expansion may have an adverse effect of the precision of the silicon type pressure transducer since temperature changes will cause stress in the device which may be erroneously indicated as changes in pressure.

The second major problem of the conventional frit method is that the thin wall or diaphragm of silicon is not always uniform in thickness because of inherent difficulties in accurately controlling the etching step which forms the cavity. Using conventional etching techniques, variations of up to about 30% in diaphragm thickness are not uncommon. Ideally, the thickness of the silicon diaphragm should be uniform so that the transducer will have more sensitivity to small changes in pressure and will exhibit uniform and reproducable results.

Other problems that are inherent in the above frit method of making silicon type pressure transducers include the long periods of time required to fire the glass frits. With most glass frits used in silicon type pressure transducer manufacture, cycle times for firing in the order of several hours are required.

A further problem in making silicon type pressure transducers by the frit method is that during firing of the glass frit to bond the silicon slices together, gas bubbles may be formed which may prevent uniform bonding on the bonding surfaces or may even cause the sealing of the cavity to be non-hermetic. In such a non-hermetic seal, the transducer would not operate as intended since the pressures on both sides of the diaphragm would be equal or at least would not give a true indication of the pressure difference between the external atmosphere and the cavity.

In an alternate method for making silicon type pressure transducers which attempted to improve on the above described structure and method, field-assisted bonding has been employed to seal a silicon diaphragm containing a diffused circuit to a tube of glass which thermally matches the silicon of the diaphragm. (For example, see U.S. Pat. No. 3,697,917 granted on Oct. 10, 1972 to Orth and Yerman). While good results have been reported, the above method is not suitable for mass production because the geometry of the components is such that each pressure transducer must be assembled and bonded individually. In contrast, the above mentioned frit method utilizes a whole slice of silicon containing numerous transducers which is assembled in a single batch process and then the individual transducers separated from each other after assembly.

It is therefore a feature of the present invention to combine the best features of the frit method with the field-assisted bonding method so that the latter may be used in a manner suitable for mass production. Another feature of the present invention is that field-assisted bonding is used in making a plurality of silicon type pressure transducers. Yet another feature of the present invention is that coefficients of thermal expansion of the components of silicon type pressure transducers may be closely matched. Another feature of the present invention is that variations in diaphragm thickness for silicon pressure transducers are reduced. Yet another feature of the present invention is that the time required to bond the components of silicon type pressure transducers is significantly reduced. Another feature of the present invention is that the formation of bubbles during bonding of components for silicon type pressure transducers is significantly reduced or eliminated. Another feature of the present invention is that etching of the silicon component of a pressure transducer may not be required.

These and various other features of this invention will be more fully apparent from a detailed consideration of the remainder of this disclosure including the examples and the appended claims in conjunction with the accompanying drawings, in which:

FIG. 1 of the drawing is a cross-sectional view of several known silicon type pressure transducers produced by the frit method.

Figure 2:
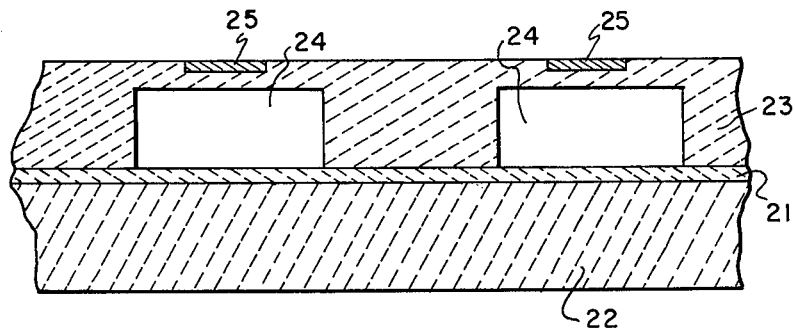

FIG. 2 of the drawing illustrates one embodiment of the present invention which is a structure containing a plurality of silicon type pressure transducers.

Figure 3:
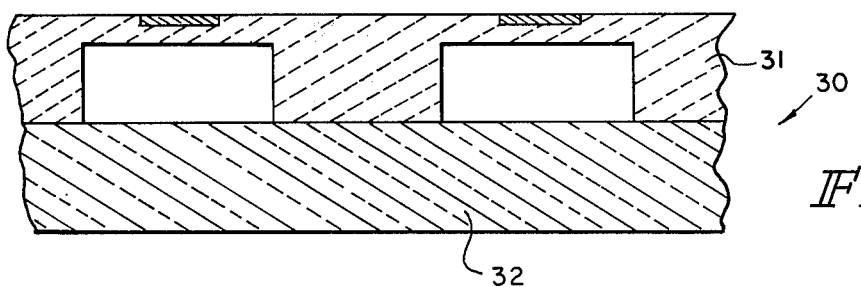

FIG. 3 of the drawing illustrates another embodiment of the present invention which is a structure containing a plurality of silicon type pressure transducers.

Figure 4:
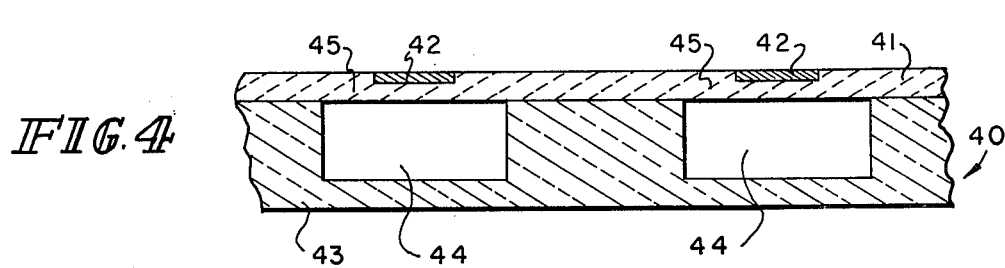

FIG. 4 of the drawing illustrates the preferred embodiment of the present invention which is a structure containing a plurality of silicon type pressure transducers.

Generally, the present invention relates to the application of field-assisted bonding to the mass production of silicon type pressure transducers and the structure resultant therefrom. More specifically, in one embodiment, the invention comprehends the replacement of the glass frit bonding means for two silicon slices containing a plurality of individual transducers by field-assisted bonding of the two silicon slices to an intermediate glass which has a compatible coefficient of thermal expansion with silicon. In another embodiment, the operative silicon slice containing the cavities and diffused circuits for a plurality of transducers is field-assisted bonded to a glass slice of about the same thickness having a compatible coefficient of thermal expansion with silicon. In the preferred embodiment, a silicon slice of the thickness of a diaphragm and having the appropriate diffused integrated circuits for a plurality of transducers is field-assisted bonded to a glass slice having the required cavities and a compatible coefficient of thermal expansion with silicon.

The term field-assisted bonding as used herein refers to a technique or process of joining an electrical insulator to an electrical conductor or an electrical insulator to an electrical insulator at a relatively low temperature. The process comprises placing the surfaces of two or more structures to be joined in close proximity and then while heating the structures to a temperature of less than the fusion point of either material, creating an electrical potential difference between the close proximity surfaces to provide a high voltage gradient between such surfaces of the structures to help bond the surfaces. As a general rule, temperatures of above about 500° C are not required for good bonding. The process produces bonds of relatively high strength in a short time, usually in a matter of minutes. The field-assisted bonding process for joining various materials is described in much greater detail in U.S. Pat. No. 3,397,278 granted to D. I. Pomerantz, U.S. Pat. No. 3,417,459 granted to D. I. Pomerantz et al, U.S. Pat. No. 3,506,424 granted to D. I. Pomerantz and others.

The application of this bonding process to the mass production of silicon type pressure transducers and the resultant advantages derived therefrom can be more clearly shown with reference to the FIGURES of the drawing.

FIG. 1 is a cross-sectional view of a portion of a conventionally made structure 10 containing a plurality of silicon type pressure transducers before separation into individual transducers which consists of two silicon slices 11 and 12 bonded together by a layer of glass frit 13. Silicon slice 12 contains etched cavities 14 and diffused integrated circuits 15. Once the silicon slices 11 and 12 are bonded together, the slices may be separated along the dotted line 17 into individual pressure transducers. The diaphragms 16 of the transducers are much thinner than the rest of the walls of the transducer and are sufficiently thin so as to deform whenever the external pressure is different than the pressure inside the cavities 14. In absolute pressure transducers, the cavities 14 contain a vacuum. In pressure transducers that measure relative pressure, the cavities are filled with air or some other gas.

As set forth previously, there are numerous problems associated with the frit method of making this type of transducer including the difference in coefficient of thermal expansion between the glass frit 13 and the silicon slices 11 and 12 which may result in inaccurate output of the device during changes in temperature. In addition, the use of glass frits in bonding the components of the above silicon type pressure transducers requires heating times on the order of several hours and during the heating, gaseous products in the form of bubbles may be produced which may result in non-uniform bonding and even to leaks to the cavities 14 of the transducers. The embodiment of FIG. 2 helps to solve these particular problems in the mass production of silicon type pressure transducers.

FIG. 2 illustrates a cross-sectional view of a portion of a structure 20 containing a plurality of transducers wherein the glass frit 13 as shown in FIG. 1 has been replaced by glass 21 having a coefficient of thermal expansion which approximately matches that of the silicon of the slices 22 and 23. A glass having a comparable coefficient of thermal expansion can be used because the glass does not have to be heated to its fusion point to bond the slices 22 and 23 together using the field-assisted bonding technique in accordance with this invention.

In practice, the slices 22 and 23 are joined in a two-step process. A relatively thick glass plate, (not shown) typically about 10 mils in thickness, is first field-assisted bonded to the base silicon slice 22. After bonding, the glass plate is lapped and polished to a thickness of about one mil and then field-assisted bonded to etched slice 23 containing cavities 24 and diffused circuits 25. It has been found that glasses sold under the tradenames Corning 7740 and Corning 7070 glass have compatible coefficients of thermal expansion with monocrystalline silicon and may be bonded to silicon quite easily using the field-assisted bonding technique.

An alternative and less expensive solution to that presented in FIG. 2 is to replace the base silicon slice entirely with a slice of glass having a compatible coefficient of thermal expansion as in the embodiment of the invention shown in FIG. 3. In FIG. 3, the structure 30 containing a plurality of transducers includes an etched silicon slice 31 similar to slices 12 and 23 as shown in FIGS. 1 and 2. Slice 31 is, however, field-assisted bonded to a slice of glass 32 of approximately the same thickness. Again, an example of a glass suitable for slice 32 having a coefficient of thermal expansion near that of silicon is Corning 7740 or Corning 7070 glass.

The mass production method of making the structure 30 is somewhat simplified as compared to that of the structure 20. The field-assisted bonding step is only required once as opposed to twice and the step of lapping and polishing the slice 21 after the first bonding step has been eliminated. Furthermore, an additional advantage is that it is possible to visually inspect the bond between the glass 32 and the silicon slice 31 and therefore expensive testing of the structure for hermeticity of the bond is no longer necessary.

Although both of the above methods and structures for silicon type pressure transducers are significant improvements over the prior art, they do not help to alleviate the problem of variable diaphragm thickness in conventionally produced transducers.

FIG. 4 illustrates a preferred embodiment of the present invention which helps to reduce the variability of transducer diaphragm thickness while still allowing mass production techniques. Structure 40 containing transducers includes a thin slice of silicon 41 with the appropriate integrated circuits 42 diffused thereon, and a thicker slice of glass 43 with cavities 44 etched or bored within the glass slice. The composition of glass slice 43 is selected so as to have a compatible coefficient of thermal expansion with the silicon of slice 41. The thickness of a silicon slice 41 determines the thickness of the diaphragms 45 for the transducers and can be readily controlled for a uniformity in thickness of the diaphragm.

To make the structure 40, a slice of silicon (not shown) of greater thickness than the slice 41 is diffused with impurities, as is known in the art, to produce the required integrated circuits 42 on one surface of the slice. The opposite surface of the slice (not shown) is then mechanically lapped and polished to the desired thickness for the diaphragms 45 of the transducers by well known techniques such as is known in the beam lead technology to yield slice 41.

A thicker slice of glass 43 is then provided with cavities 44 by techniques such as photolithographic masking plus etching, ultrasonic machining, mechanical drilling or the like. The glass slice 43 is then joined to the silicon slice 41 by field-assisted bonding to yield the structure 40.

Several important advantages accrue by making silicon type pressure transducers in the above manner. A major advantage is that a plurality of transducers may be made in one bonding operation. Another advantage is that whereas the cavities in the silicon slice of the prior art transducers made by the frit method had critical dimensions in that their depth determined the thickness and uniformity of the diaphragm, the dimensions and especially the depth of the cavity 44 in the glass plate 43 are far less critical. Thus the variable factors of etching affecting the final thickness and uniformity of the diaphragm have been eliminated.

In addition, a given volume of glass is generally less expensive than a like volume of silicon so cost advantages are realized by the substitution of the materials. This cost advantage becomes especially significant if the cavities are defective in some way so that a glass slice would be discarded rather than a more expensive slice of silicon. Also, by the use of glass as a base material the bond quality between the glass slice and silicon slice can be visually inspected as in the embodiment shown in FIG. 3.

Since all of the structures illustrated in FIGS. 2-4 are made by using the technique of field-assisted bonding, several other important advantages are realized. As the temperatures used to achieve bonding do not approach the fusion temperature of any of the components, the formation of gaseous products in the bonding area is essentially eliminated. Any formation of gaseous products may harmfully affect the hermetic nature of the bond about the cavities in the structure. In addition, by utilizing the lower bond temperatures of field-assisted bonding as compared to fusion bonding, the risks of deterioration of the diffused integrated circuits are significantly reduced.

Another advantage is that while bonding by fusion with glass frit requires firing time cycles of several hours, bonding of the components of the structure with field-assisted bonding typically only requires cycle times of less than ten minutes. Thus significant savings of time and heat energy are realized according to the present invention.

The most significant advantage of the present invention is that the method allows the mass production of hundreds of transducers with one assembly and bonding operation without the previously recited inherent disadvantages of the frit method.

In comparison with the method of making a structure of the Orth and Yerman type mentioned previously, the present invention has several advantages, the most important being that a multiplicity of transducers may be bonded together in one operation thus saving considerable time and labor. Also alignment of the components before joining is simplified as many transducers may be aligned in one operation. In addition, prior to the joining operation it is generally easier to handle a large slice than smaller individual components for the transducer especially during the polishing operation.

A structure containing a plurality of silicon type pressure transducers made according to this invention is presented in the following example. It should be understood that the example is given for the purposes of illustration only and the example does not limit the invention as has heretofore been described.

EXAMPLE

A structure containing several pressure transducers as shown in FIG. 4 is made according to the present invention.

A slice of monocrystalline silicon approximately one inch square is provided with diffused integrated circuits by well known techniques. The slice is then lapped and polished to a thickness of about 2 mils. A square slice of glass of approximately one quarter inch thick is ultrasonically machined to provide nine cavities in a three by three matrix, the cavities being about one eight inch in depth and about one quarter inch in diameter. After machining, the glass slice is also polished.

The silicon slide is then laid over the cavities in the glass slice and the diffused circuits aligned with the cavities. After heating the slices to about 400° C, a positive probe of a 1000V DC source is contacted to the silicon slice and a negative probe is contacted to the glass slice for about three minutes to create an electrical potential difference between the surfaces of the silicon slice and the glass slice so as to provide a high voltage gradient between such surfaces to help bond the slices together into a structure as shown in FIG. 4. Once cooled, the structure may be separated into individual tranducers.

Thus the invention as has been described provides a silicon pressure transducer that is less costly and tedious to manufacture and which gives improved reliability and performance in operation. By utilizing field-assisted bonding in the mass production of silicon pressure transducers, many disadvantages inherent in structure made by prior art techniques are significantly reduced or eliminated, such as mismatches of coefficients of thermal expansion, non-uniformity of the silicon diaphragm thickness, deterioration of the device characteristics due to high bonding temperatures, formation of gaseous products at the bond interface, long firing cycle times, and inadequate or nonuniform bonding between transducer components, while at the same time allowing for economics of time and labor by utilizing mass production techniques.

The term slice as used herein generally refers to a three-dimensional solid having at least two approximately parallel surfaces. So as an example, a rectangular plate where the thickness is smaller than the length or width may be termed a slice.

Although the present invention has been discussed exclusively with reference to silicon type pressure transducers, it is recognized that certain materials other than silicon function as semi-conductors and have significant piezoresistive properties and it is to be understood that the use of such materials is contemplated by the present invention. A material having piezoresistive properties is one whose electrical resistivity changes when distorted.

While the present invention has been described with reference to particular embodiments thereof, it will be understood that numerous modifications may be made by those skilled in the art without actually departing from the spirit and scope of the invention as defined in appended claims.

We claim:

1. In a method of making a structure containing a plurality of pressure transducers and adapted to be separated into individual pressure transducers, the steps comprising providing a diaphragm comprising a slice of semiconductor containing material having first and second surfaces with a plurality of diffused circuits on said first surface of the slice and a slice of glass containing material having a plurality of cavities formed on one surface and having a substantially equal coefficient of thermal expansion with the semiconductor containing material, and joining the slice of semiconductor containing material at said second surface by field assisted bonding to the slice of glass containing material so as to close the cavities in the slice of glass containing material.

2. In the method of claim 1 wherein the slice of semiconductor containing material is silicon containing material.

3. In the method of claim 1 wherein after joining the slices into a structure, separating the structure into a plurality of physically disunited transducers.

* * * * *